United States Patent [19]
Reed

[11] Patent Number: 4,969,018
[45] Date of Patent: Nov. 6, 1990

[54] QUANTUM-WELL LOGIC USING SELF-GENERATED POTENTIALS

[75] Inventor: Mark A. Reed, Dallas, Tex.

[73] Assignee: Texas Instruments Incorp., Dallas, Tex.

[21] Appl. No.: 626,807

[22] Filed: Jul. 2, 1984

[51] Int. Cl.⁵ .................................... H01L 29/88
[52] U.S. Cl. .................................... 357/12; 357/4; 357/16
[58] Field of Search .................. 357/4, 12, 16

[56] References Cited

U.S. PATENT DOCUMENTS

| | | | |
|---|---|---|---|
| 4,163,238 | 7/1979 | Esaki et al. | 357/16 |
| 4,261,771 | 4/1981 | Dingle et al. | 357/12 |
| 4,503,447 | 3/1985 | Iafrate et al. | 357/12 |

FOREIGN PATENT DOCUMENTS

| | | | |
|---|---|---|---|
| 68064 | 1/1983 | European Pat. Off. | 357/12 |
| 2607940 | 9/1977 | Fed. Rep. of Germany | 357/4 SL |
| 52-105785 | 9/1977 | Japan | 357/4 SL |

Primary Examiner—William D. Larkins

[57] ABSTRACT

A new kind of electronic logic circuit, wherein potential wells (e.g. islands of GaAs in an AlGaAs lattice) are made small enough that the energy levels of carriers within the wells are discretely quantized. This means that, when the bias between the wells is adjusted to align energy levels of the two wells, tunneling will occur very rapidly, whereas when the energy levels are not aligned, tunneling will be greatly reduced. In particular, the wells are optimized to have sharp enough resonant tunneling peaks that the change in potential caused by the difference between the number of carriers stored between two adjacent tunnel wells is itself enough to permit or preclude resonant tunneling. Thus, a tremendous variety of logic functions, including all primitive Boolean functions can be embodied in this logic.

21 Claims, 15 Drawing Sheets

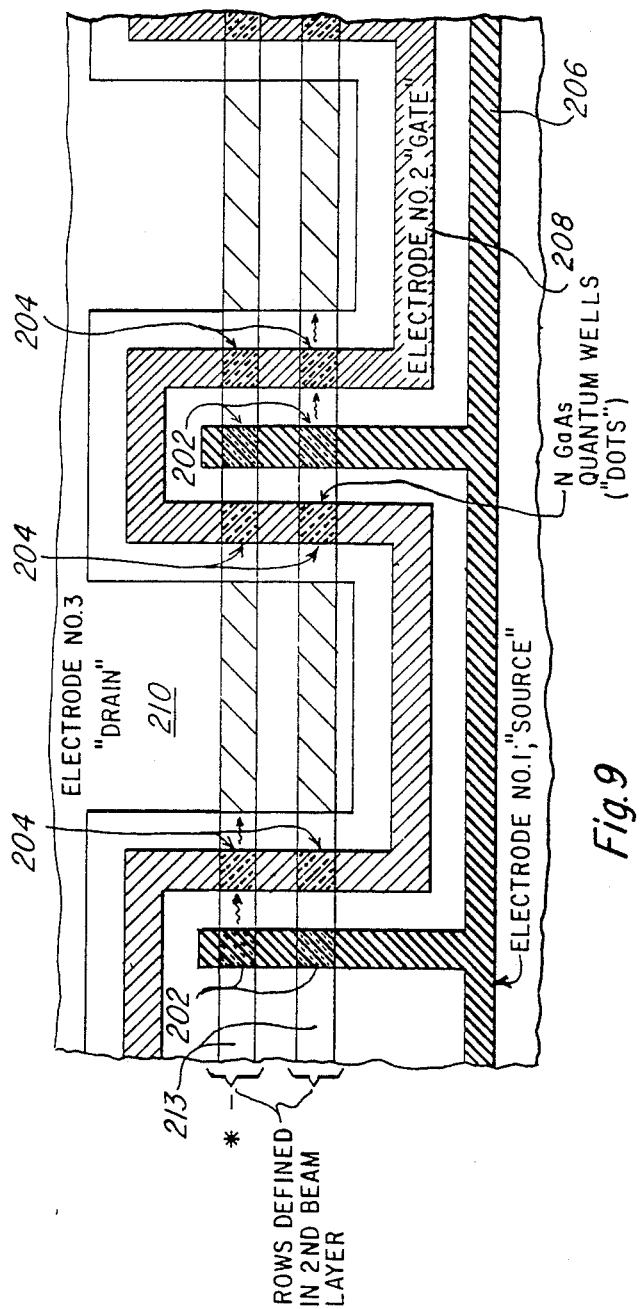
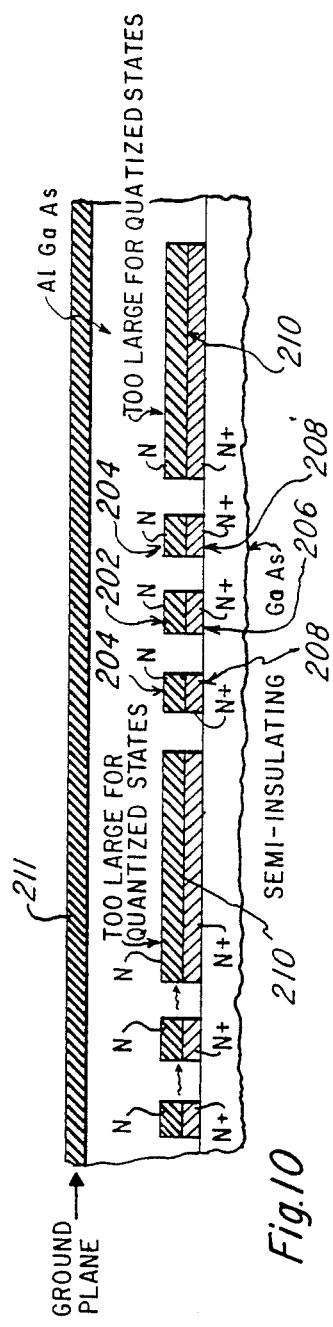
Fig. 9
Fig. 10

THIS TRUTH TABLE IS

| | | | | | | | | |
|---|---|---|---|---|---|---|---|---|
| A | 0 | 1 | 0 | 0 | 1 | 1 | 0 | 1 |
| B | 0 | 0 | 1 | 0 | 1 | 0 | 1 | 1 |
| (C) | 0 | 0 | 0 | 0 | 1 | 0 | 0 | 1 |
| D | 0 | 0 | 0 | 1 | 0 | 1 | 1 | 1 |
| R | 0 | 0 | 0 | 0 | 0 | 1 | 0 | * |

* — CAN BE 0 OR 1 !

QUANTUM-WELL LOGIC USING SELF-GENERATED POTENTIALS

CROSS-REFERENCE TO RELATED APPLICATIONS

The following copending applications disclose related subject matter: Ser. Nos. 626,802, 626,808, 626,809, 626,551, 626,342, and 626,806, all filed Jun. 29, 1984.

BACKGROUND AND SUMMARY OF THE INVENTION

The present invention relates to electronic devices.

It is generally recognized that conventional VLSI integrated technical technology will be prevented from further scaling by the time MOS devices get down to a quarter micron channel length, and perhaps even at much larger geometries. Since much of the advance in integrated circuit capabilities has been based on the continued progress of scaling, this near-future barrier is of substantial concern.

Thus it is an object of the present invention to provide an integrated circuit technology wherein active devices can have active regions smaller than one quarter micron in dimension.

It is further object of the present invention to provide an integrated circuit technology wherein active devices can be fabricated which occupy a total area of less than ¼ of a square micron average for each active device.

A further inherent limitation of conventional integrated circuit technology is speed. MOS devices have inherent limits on their speed due to the channel-length transit time. Intergrable bipolar devices also have inherent speed limitations, due to the base width transit time, and are also likely to have high power dissipation.

Thus it is an object of the present invention to provide an active device having higher potential maximum speed than any MOS device.

It is a further object of the present invention to provide an active device which is potentially faster than any bipolar device.

It is a further object of the present invention to provide an active device which is potentially faster than any bipolar device, and which also has a very low power dissipation.

To achieve these and other objects, the present invention provides: a new genus of electronic devices, wherein at least two closely adjacent potential wells (e.g. islands of GaAs in an AlGaAs lattice) are made small enough that at least two components of momentum of carriers within the wells are discretely quantized. This means that, when the bias between the wells is adjusted to align energy levels of the two wells, tunneling will occur very rapidly, whereas when energy levels are not aligned, tunneling will be greatly reduced. This high-gain mechanism leads to useful electronic device functions.

A difficulty in making quantum-coupled devices into functional electronic circuits is that these devices are so extremely small that it is typically necessary to run a number of them in parallel to provide macroscopic output currents. In addition, the routing of wiring to couple into and out of these multiple parallel active devices is also difficult, since the tight geometry constraints of the devices place substantial constraints on the geometry which must be used for the wiring.

Thus, if these novel quantum devices are to be used to configure logic, it would be preferable to do so in such a way that the number of points where translation from quantum-well logic levels (which are essentially single-carrier or few-carrier transitions, all of these transitions may occur very rapidly) to macroscopic currents (those normally used in integrated circuits) is minimized, since these transitions lose some of the density and speed economy of the quantum coupled devices.

Thus it is an object of the present invention to provide an electronic logic structure in which logic functions can be embodied entirely in quantum-coupled devices, without intermediate stages using macroscopic currents.

It is a further object of the present invention to provide an electronic logic wherein all Boolean primitive logic functions can be embodied entirely in quantum-coupled devices, without intermediate stages using macroscopic currents.

It is an object of the present invention to provide an electronic logic family wherein numerous logic functions, including exceedingly complex logic functions, can be embodied entirely in quantum-coupled devices, without intermediate stages using macroscopic currents.

According to the present invention there is provided:
An electronic device comprising:
first and second potential wells each comprising an island if a semiconducting material, said first and second wells being sufficiently small in all three dimensions that energy levels within each of said wells are separated by more than one half millielectronVolt;
a barrier medium, interposed between said first and second wells, wherein the minimum potential energy of carriers is higher than the minimum potential energy of carriers within said wells;
said wells being physically separated by a distance which is less than 300 Angstroms;
means for inputting carriers into said first well;
means for removing carriers from said second well;
said energy levels of said wells being such that, under a first bias condition, at least one of the five lowest-lying discrete energy and momentum states in said first well is aligned with a discrete state in a said second well if and only if the difference between the number of occupied states in said first well and the number of occupied states in said second well is a predetermined number.

BRIEF DESCRIPTION OF THE DRAWINGS

The present invention will be described with reference to the accompanying drawings, wherein:

FIG. 9 shows another three-terminal quantum-well device according to the present invention, wherein multiple chains of quantum-well pairs are connected in parallel;

FIG. 10 shows a cross-section of the device of FIG. 9;

FIGS. 13 shows a sample set of bias conditions for the embodiment of FIG. 11 wherein resonant tunnelling does not occur;

DESCRIPTION OF THE PREFERRED EMBODIMENTS

The present invention teaches active devices which are fundamentally different from the transistor and diode structures which have been used heretofore in the electronics industry to configure integrated circuits. That is, active devices taught by the present invention are neither field effect transistors nor bipolar transistors, but operate according to principles which are fundamentally and entirely different.

A key feature of many embodiments of the invention is a pair of closely coupled quantum wells which are each extremely small, so small that their electron populations are quantized, i.e. an electron in a well can only have one of a few allowable energies. The present invention teaches modes of device operation which cannot be analyzed by classical physics, but must be understood in light of quantum mechanics.

Advances in semiconductor processing now permit semiconductor structures to be patterned with exceedingly small dimensions, comparable to the Bloch wave length of an electron. (The Bloch wavelength measures the "width" of an electron in a semiconductor. The location of an electron must be measured by a probability distribution, which has a certain width.) The present invention makes use of the availability of patterned structures in dimensions which are close to the Bloch wave length to achieve new types of device structures, capable of new principles of operation of a kind not seen before in semiconductor or integrated circuit devices.

Figure 1A:
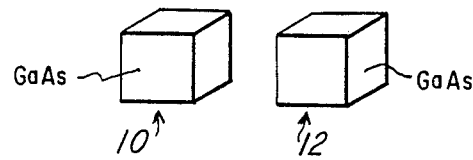
FIGS. 1A and 1B show spacing and energy levels of potential wells in a sample embodiment.

A simplified sample embodiment, which demonstrates some of the key principles of operation used in the present invention, is shown in FIG. 1. Separate wells of gallium arsenide are embedded in a matrix of aluminum gallium arsenide. As is well known in the semiconductor art, the bandgap of AlGaAs is wider than that of GaAs. (More precisely, the pseudo-binary alloys of the formula $Al_xGa_{1-x}As$ are all semiconductors, with a bandgap which increases as a function of x.) This different bandgap means that conduction-band electrons in the lattice see a lower potential energy in the GaAs regions than in the AlGaAs regions. A particular advantage of this material system is that the interface between GaAs and AlGaAs is a very well behaved one, that is such interfaces can be fabricated with an extremely low density of surface states (less than the $Si/SiO_2$ interface), and can preserve lattice match almost perfectly between the GaAs and the AlGaAs sides of the interface. However, as will be discussed below, the present invention can be practiced with a wide variety of material systems, and not only semiconductors.

In the sample embodiment of FIG. 1, the wells 10 are about 125 angstroms wide, and the spacing between the wells is also about 125 angstroms. The dimensions of these wells are small enough that the energy states of electrons in the well will be quantized. That is, these wells are preferably made cubic, and the allowable energy states of an electron in a cubic well of such dimensions can be calculated easily, using the effective mass approximation for the behavior of the electron, as a simple particle in a box problem in quantum mechanics. Thus, for example, for the well dimensions given above, and an aluminum concentration of 35%, there exist four allowable energy states, and the lowest lying energy state will be above the bottom of the GaAs conduction band minimum and will be separated from the next lowest energy state by 0.070 electron volts. The next higher lying energy state will lie another 0.114 electron volts higher. Note that these energy states must be treated as quantized. That means that the energy of an electron in the well must be exactly equal to one of these permitted discrete energy levels and cannot take any other value. This is key to the present invention. Note that this is a fundamental difference from normal semiconductor devices (even from the advanced semiconductor devices projected to be achievable by scaling present semiconductor devices), in that all conventional solid state devices—be they field effect or bipolar transistors or anything else—require that the energy levels of an electron within the conduction band of the semiconductor be quasi-continuous.

It should be noted that the number of electrons which can populate each energy level in such a quantized system is strictly limited. That is, the lowest lying energy level in each well in this example can be populated by only two electrons, the next level up can be populated by only six electrons, the next level up can be populated by only ten electrons, and so on. This means that the number of carriers within a well is strictly limited. Thus, a carrier cannot tunnel to an energy state in the next well if that energy state is already completely filled. While each well can hold only a few carriers at a time, it should be noted that the transition times are expressly short (typically far less than a pico-second), and total current can be increased by operating m any pairs of wells in parallel.

Figure 1B:
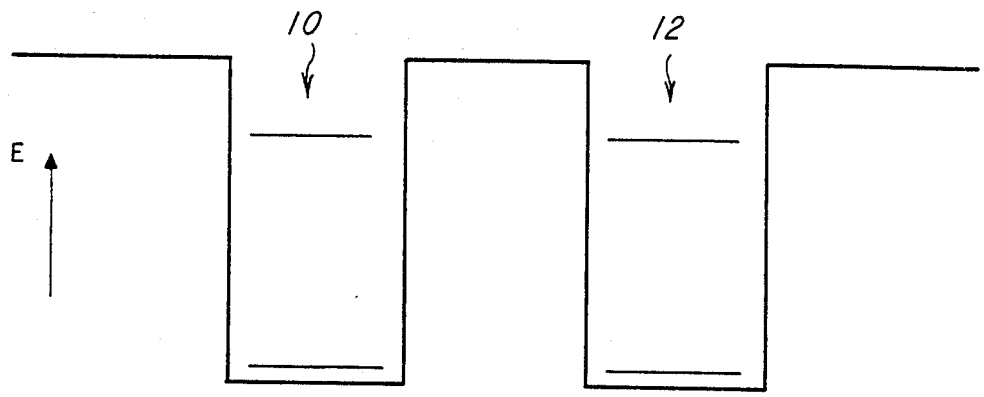

Now, in the sample embodiment the wells are placed sufficiently close such that the probability density of an electron in one well extends into the neighboring well; that is, the wells 10 and 12 in FIG. 1 are close enough together that electrons can tunnel between them easily. In particular, as shown in FIG. 1b, an electron in the first well can tunnel easily to a state of equal energy in the second well, but of course it cannot do this unless an unoccupied state having the same energy actually exists in the second well. However, suppose that the energy levels in the two wells do not line up. Then an electron in the first well can only tunnel to states of the second well which have a different energy than the first well, and it can only tunnel to such states if there is also some mechanism whereby the electron can lose or gain enough energy to reach the energy of the lower-lying available state in the second well.

The chief mechanism for the changing of the energy of an electron to achieve tunnelling in this fashion is relaxation via surface states. That is, even the GaAs to AlGaAs interface, which is exceedingly benign as semiconductor interfaces go, will have a measurable density of surface states at the interface. Such surface states provide a scattering process will permit an electron to transfer to higher or lower energy, if it intersects one of the available sites for scattering. That is, the interface can be described as having an areal density of scattering sites which are capable of changing the energy from an electron so that it can make the transition between wells even when the energy levels of the wells do not line up. This mode of transition is known as inelastic tunneling. The alternative mode of tunneling, wherein the electron tunnels from the first well to the second with no change in energy, is known as resonant tuneling.

Tunneling requires conservation both of energy and also of momentum. Momentum is also quantized for small potential wells. That is, in each dimension of the box which defines the boundaries of the potential well, the smaller the length of that dimension the more widely spaced the allowable values of that component of momentum will be. Thus, as reported in the Soloner et al. article cited below, resonant tunneling can occur between two very closely spaced thin sheets of lower potential. Since the potential wells are very large in two dimensions, the momentum components in those two dimensions are not quantized. That is, when one dimension of a potential well is large, the momentum components in that direction are so closely spaced that a background lattice phonon will be available to supply the momentum difference. That is, the density of phonons found in the latice follows Bose-Einstein statics, (ie. the number of phonons found in the lattice at energy E in a background lattice temperature T varies as 1 over (EXP ((E/k T)-1)). This energy distribution of phonons also implys a distribution for the magnitude of momentum of the phonons, and, since the phonons can be treated as approximately isotropic in reasonable semiconductor materials, this same distribution also specifies the distribution of phonons having a desired value of some one particular component of momentum. Thus, the quantization of momentum in a potential well can be considered as discrete or quasi-continuous only in relation to temperature. That is, for example, a 1000 angstrom wide box will result in momentum quantization at one degree Kelvin, since the phonon population will be crowded into energetically low states, but at 300K there would be a tremendous lattice background phonon population to bridge gaps between the allowable momentum values, and thus the separation between the allowable momentum values in this direction would not be meaningful, i.e. momentum in this direction would have to be treated as a quasi-continum value, i.e. any value of this momentum component which an incoming carrier had would still permit tunneling, since lattice phonons could adjust this momentum component to one of the allowable values. If all three components of momentum are discretely quantized, then it follows that energy must be discretely quantized also. The quantization of energy levels is (to a rough approximation) merely dependent on the volume of the potential well, so that a thin flat potential well could have quantized energy states and sharply separate discrete allowable levels for one component of momentum, whereas the allowable values of the other two momentum components will be closely spaced, so that they impose no practical constraint on tunneling.

That is, the resonant tunneling gain is enhanced in accordance with the number of parameters which must be met. In tunneling between two closely spaced cubic potential wells, all three components of momentum (and therefore energy) must match between the state which the carrier is leaving in the first well and the state which the carrier is entering in the second well. That is, if an incoming carrier does not satisfy all three momentum constraints, the chances of it finding a lattice phonon which has exactly the right components to satisfy the difference in each of the three momentum values is quite small. However, if only one component must be adjusted, the chances of accidentally doing this by interaction of the lattice phonon are much greater.

Thus, the preferred embodiments of the present invention use structures wherein all three components of momentum are quantized. However, a class of less preferred alternative embodiments of the present invention uses structures wherein only two components of momentum but not energy are quantized, i.e. closely spaced thin wires. It is easy to satisfy the momentum constraint alone by phonon-assisted process, but the necessity for satisfying both energy and momentum conversation is what keeps the rate for inelastic tunneling background controlled. That is, if a scattering center at the matallurgical interface can change the energy of a carrier, it is easy for one of the lattice phonons to provide the appropriate adjustment in momentum.

As device dimensions are made smaller, two desirable effects are achieved: First, the separation of the quantized energy states in a well increases as the well dimension becomes smaller. Second, as the wells become closer together, the rate of tunneling is increased. That is, the probabilility of tunneling can be expressed as a constant times $\exp(-2f(E))$, where d is the distance between the wells and E is the energy difference.

This exponential dependance means that the probability of resonant tunneling is tremendously increased as the distance between wells is reduced. Inelastic tunnelling will not be increased comparably, since as noted above inelastic tunnelling is limited, in good material, by the density of scattering centers. Thus, room temperature operation becomes possible at interwell spacing of about 125 A or less.

A limitation on resonant tunneling is provided by thermal "smearing", i.e. redistribution of energy level populations caused by background thermal energy. That is, the density of states distribution within each well of the discrete energy levels is broadened somewhat by thermal smearing. At higher temperatures, the thermal smearing is greater. The problem thermal smearing causes is that the operating temperature must be low enough that themal smearing does not populate higher energy level states. That is, the electrons should reside in the lowest energy level to eliminate accidental coincidences an bidirectional elastic tunneling. This reduces to the condition that the energy spacing must be much larger than the termal energy of the electons. Thus, for operation at 4° K. with GaAs wells in an $Al_{.3}Ga_{.7}As$ matrix, the well width (and well spacing) should be in the neighborhood of 0.1 to 0.2 microns of less. However, to increase the operating temperature to 300° K., the critical dimension needs to be reduced merely to a number on the order of 125 Angstroms or less.

Figure 2:
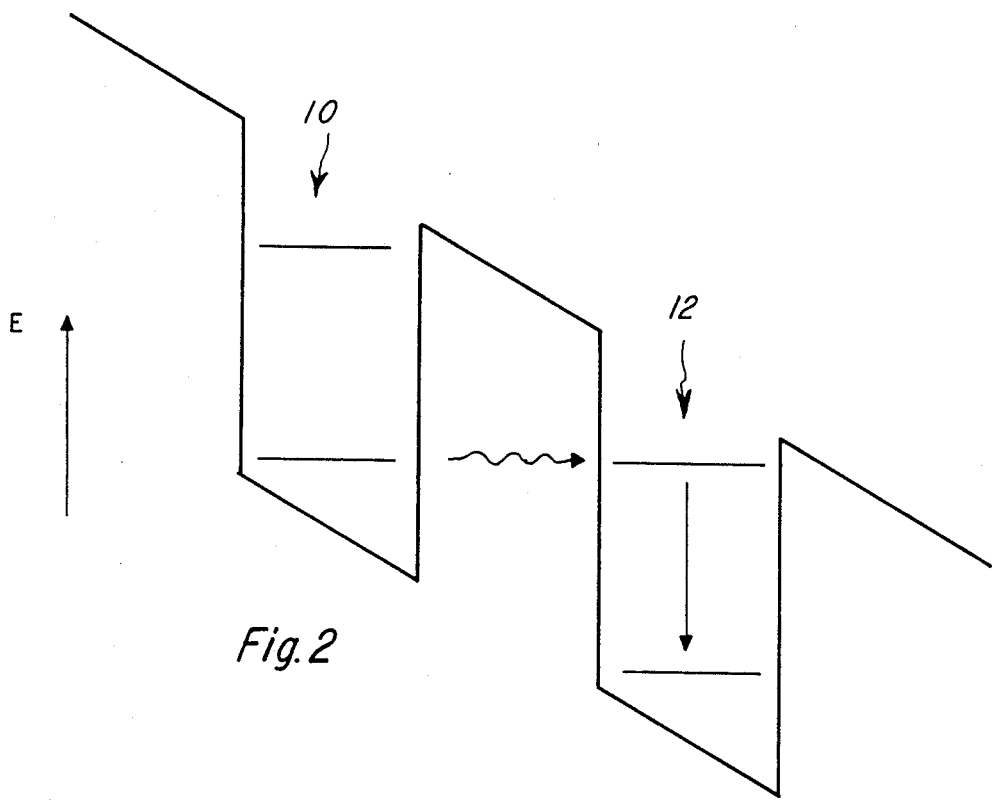
FIG. 2 shows the structure of FIG. 1, biassed to permit resonant tunnelling.

It should be further noted that the energy levels in adjacent wells can be made to line up or not line up simply by applying a bias, as shown in FIG. 2. In this case, a sufficient bias voltage has been applied in the direction of conduction, so that the second level in the second well is lined up with the first level in the first well. Under these conditions resonant tunneling will regularly occur, and the fast relaxation from the second level to the ground state in the second well ensures that the devie is unidirectional.

Figure 3:
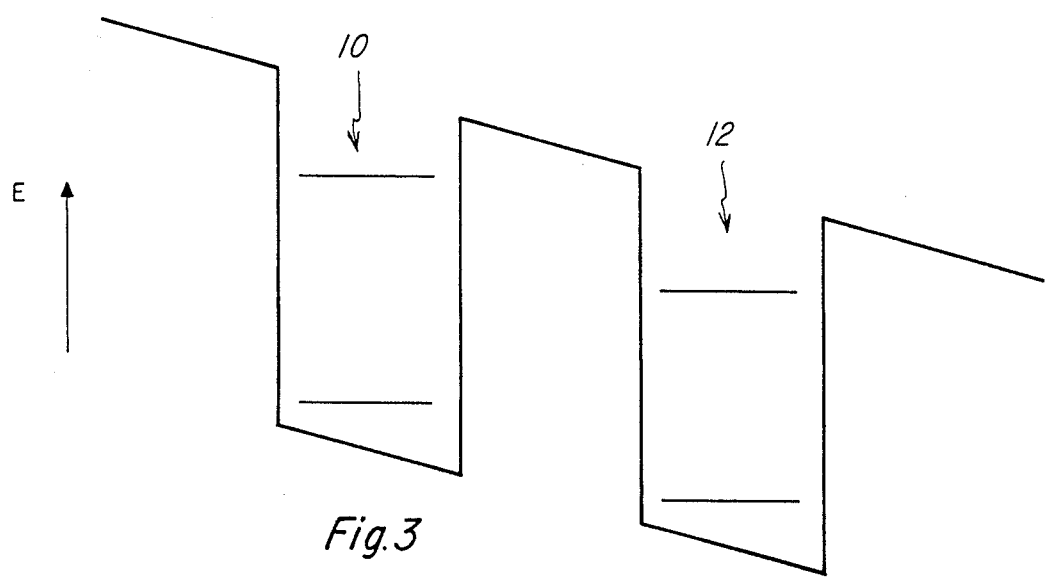
FIG. 3 shows the structure of FIG. 1, biassed at a lower voltage than shown in FIG. 2, so that resonant tunnelling is forbidden.

If zero bias were applied to this same structure, resonant tunneling would still be possible, but would be bidirectional. That is, at zero bias the energy levels in two adjacent wells will line up, but electrons will tunnel from the first well to the second well just as fast as they tunnel from the second well to the first well. Note, however, that if half as much bias as shown in FIG. 2 is applied, resonant tunneling will be forbidden (at sufficiently low temperature) and only inelastic tunneling is permissible. In this bias condition, as shown in FIG. 3, an electron can make a transition from a state in well one to an lower lying state in well two only if a scattering event also occurs, as discussed above. Thus, at small dimensions, the frequency of inelastic transitions is limited by the density of available scattering sites. However, the density of scattering sites is in effect an areal density, since it arises primarily from surface states rather than from bulk defects or particles within the crystal lattice. Thus, since the limiting factor is a areal density of defects, the inelastic tunneling current is relatively insensitive to the distance between wells. This means that, for good quality material, as the dimensions are scaled the resonant tunneling current increases tremendously, but the inelastic tunneling current does not increase much.

Figure 4:
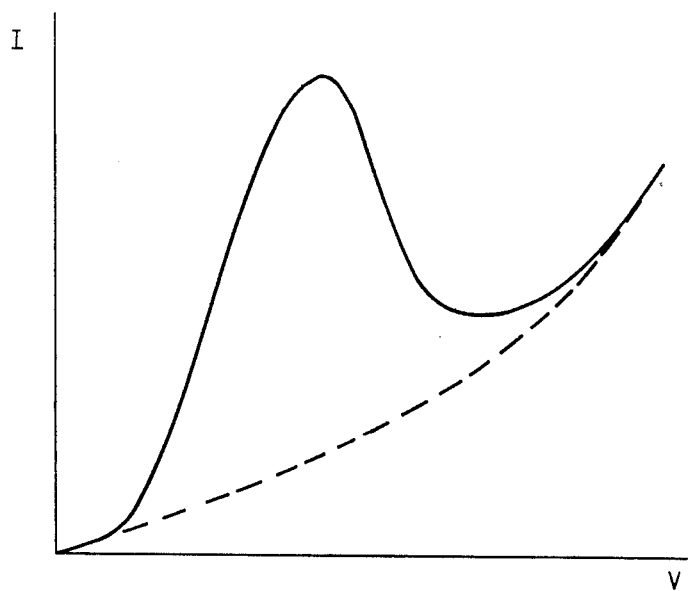
FIG. 4 shows voltage-current characteristics of the structure of FIG. 1.

The result of these phenomena is that the current/voltage graph for tunneling between two wells looks approximately as seen in FIG. 4. That is, inelastic tunneling will supply a current which increases approximately exponentially with the applied voltage. Resonant tunneling will also supply at least one current peak added on to this curve, at a bias voltage where the energy levels of the wells line up. Thus, a regime of substantial negative differential resistance is available, i.e. a millimeter diode with gain is available, as reported in Sollner et al., "Resonant Tunneling Through Quantum Wells at Frequency up to 2.5 THz," 43 Applied Physics Letters 588 (1983). (However, this article used potential wells in which only one momentum component was discrete as discussed above.) Other background reference which set forth generally known physics of resonant tunneling are Change et al., "Resonant Tunneling in Semiconductor Double Barriers," 24 Applied Physics Letters 593 (1974); Tsu et al., "Nonlinear Optical Response of Conduction Electrons in a Super Lattice," 19 Applied Physics Letters 246 (1971); Lebwohl et al., "Electrical Transport Properties in a Super Lattice," 41 Journal of Applied Physics 2664 (1970); and Vojak et al., "Low-temperature operation of Multiple Quantum-Well $Al_xGa_{1-x}As$-GaAs P-n Hetero Structure Lasers Grown by a Metal Organic Chemical Vapor Disposition,"50 Journal of Applied Physics 5830 (1979). These five references are hereby incorporated by reference. (It should be noted that portions of the foregoing discussion merely reflect geneally known physics, as reflected in these articles and pressumably elsewhere, but other portions of the foregoing discussion are not generally known and do not reflect any understanding available in the prior art.)

However, the prior art has taught potential wells which are quantized only in one dimension, which implies relaxed constraints on the selection rules for elastic tunneling. The preferred embodiments of the present invention have more stringent selection rules, and should (because all 3 dimensions are quantized) have dramatically more gain than the 1-D quantized devices. This invention is significantly different from the Esaki tunnel diode or 2-dimensional electron gas structures in that all three dimensions are quantized here, which imposes a constraint on the tunneling conditions much different than other structures; that is, the momentum constraint signifcantly depresses other than the desired elastic resonant tunneling.

Figure 5:
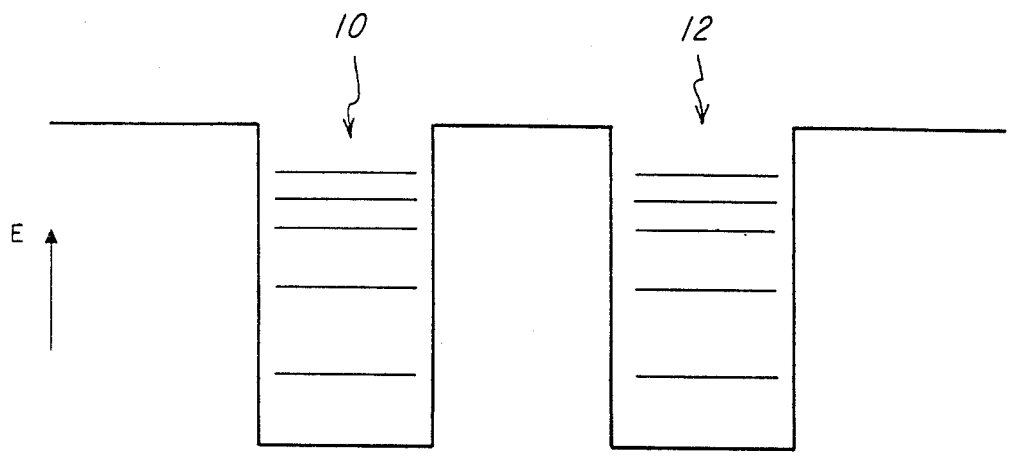
FIG. 5 shows the energy levels of an embodiment using moderately large wells, wherein the upper-lying energy levels are more closely spaced.

The foregoing has supposed that only a few quuantum levels are found in a well, but this is not correct for the most convenient well dimensions. A more realistic energy diagram of the levels in such a structure wherein 1000 angstrom GaAs wells are incorporated in an AlGaAs lattice would be as shown in FIG. 5. Note that, in the familiar statics of the solution to the particle in a box problem, the successively higher energy levels are spaced progressively closer together. This means that, even when the bias voltage is such that the lowest few levels between the two wells do not line up, some of the higher lying levels are likely to. However, this is not a major problem, since the higher lying levels will typically be depopulated because of the temperature constraint mentioned previously. That is, the lifetime for relaxation from a higher lying state to an empty lower state will typically be much shorter than the typical time for tunneling. Thus, after a lower level has been depleted by tunneling, a higher level which has been excited in any fashion will tend to relax to the depleted lower level much faster than it will tunnel. However, this assumes that empty lower levels exist below the higher level form which tunneling possible. This imposes a constraint on the input contact, which will now be discussed.

Figure 6:
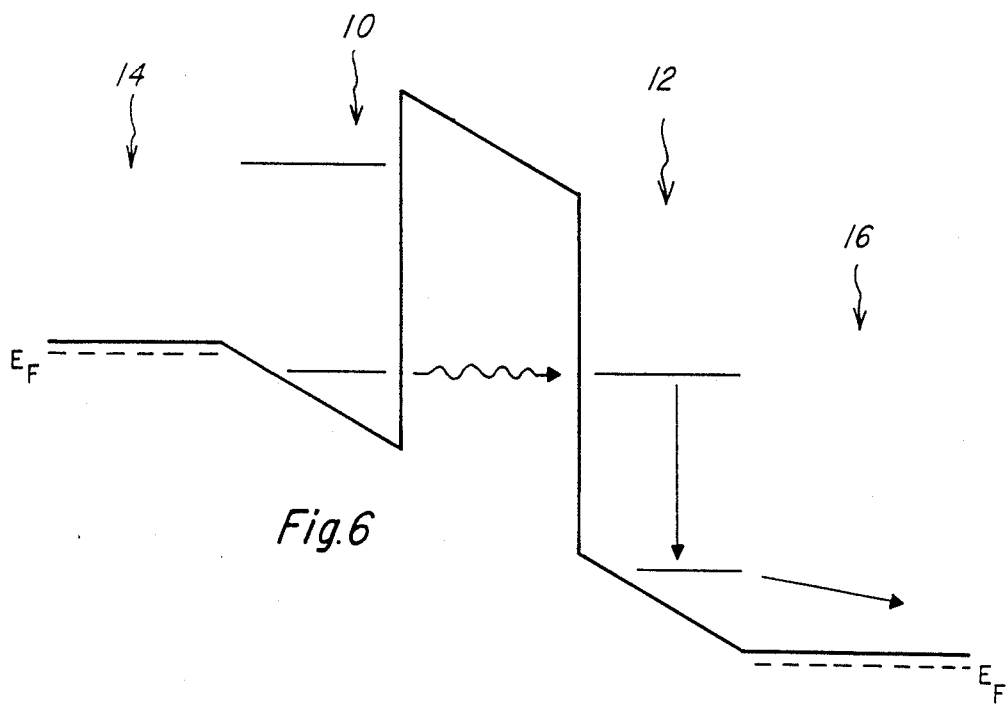
FIG. 6 shows the electronic structure of an embodiment including input and output contacts.

FIG. 6 shows the energy diagrams for a system of two coupled wells 10 and 12 plus input and output contacts 14 and 16. Note that the input and output contacts are doped, although the wells and the areas between them are preferably not. Note also that two important limitations on the wall size arise from the necessities of making input contact and output contact. First, the input contact will fill all levels of the first well 10 by tunneling, up to an energy approximately equal to the Fermi level of the electrons in the doped semiconductor which provides the input contact. This means that none of the levels thus still filled up must line up with levels in the second well when tunneling is not desired. That is, if the wells are too large, they will have discrete energy states at the bottom of the well but will include densely spaced states below the Fermi level of the input contact. This means that these densely spaced states will be filled, and therefore resonant tunneling current will be seen if any of these dense states line up with states in the second well. This means that the current gain of the device will be greatly reduced. Second, all levels in the second well which are above the Fermi level of the output contact will equilibrate with the output contact, i.e. will essentially always remain filled. This is not itself a problem, since electrons can tunnel from the higher lying energy states in the second well into the continuum of states which exists in the (large) output contact, but it any level in the first well lines up with one of these filled levels in the second well, that level in the first well will also remain filled. Note that the input and output contacts are preferably both degenerately doped n-type.

Figure 7:
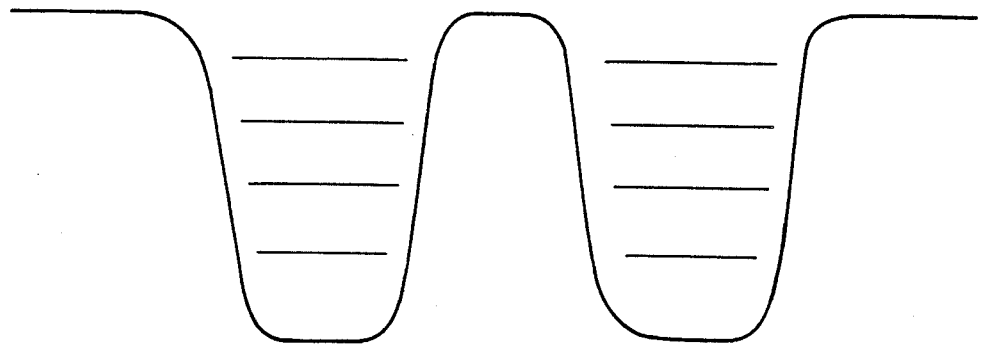
FIG. 7 shows the energy levels of an embodiment using approximately sinusoidal well boundaries, wherein the energy levels are more equally spaced.

The physical well shapes have been described as having perfectly sharp boundaries, but this is not quite realistic. That is, in good quality MBE material, the transitions will typically be smooth enough that the potential profile looks more precisely like that drawn in FIG. 7. This is actually advantageous, since the energy levels will tend to be more nearly equal spaced. That is, where the energy level spacings are more nearly equal, there is a wider range of bias conditions wherein a large number of the lower lying energy levels will not line up.

Of course, for the ultimately preferable small well dimensions, e.g. 125 angstroms, the number of states in each well will be small, e.g. 4 states per well. With such a small number of states, there will be bias conditions under which no actual line ups exist.

Each tunneling transition described above is a transition of only a limited number of electrons for each pair of coincidental states. That is, each of the discrete energy levels in the quantum well can be populated by only a certain definite number of electrons. In the example discussed above, wherein the energy well has the approximate physical shape of a cube, the lowest lying level can be populated by only two electrons, and no more. The next higher energy level can be populated by only six electrons, and no more. The third energy level can be populated by only 12 electrons, and no more. Most of the higher-lying levels can also be populated by only 12, although some may have a higher maximum occupancy because of accidental degeneracies. Thus, it is important to note that a carrier cannot tunnel into even an allowable energy level unless that allowable energy level is not completely populated. The multiple states at each allowable energy level are distinguished by other quantum numbers. That is, for example, the six electrons in a second energy level can have one of two possible states of spin, and can have one of three possible momentum vector directions. However, this distinction among isoenergetic states is relatively unimportant for understanding the present invention.

Thus, each tunneling transition can transport up to a dozen carriers for each pair of lined-up wells. More than one pair of wells may be lined up at the same time. Moreover, many pairs of wells may be operated in parallel. Moreover, the transit time for tunnelling can be extremely small, less than a pico second. Thus, although only a few electrons are translated in each tunneling event, a reasonable current density can be achieved nevertheless.

Thus, a basic family or embodiments is structures, as described above, wherein two quantized wells separate an input contact from an output contact. However, further aspect of the present invention provide numerous other kinds of innovative device structures.

Figure 8:
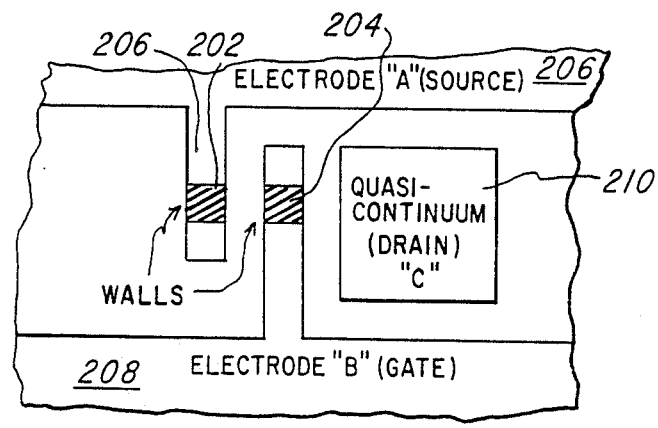
FIG. 8 shows a three-terminal quantum-well device according to the present invention.

For example, a three terminal device according to the present invention is shown in a plan view in FIG. 8. A first quantum dot 202 is coupled to a second quantum dot 204, which is coupled to an output contact 210. The dimensions of the quantum dots 202 and 204 are selected as discussed above for quantum wells, but the output contact 210 is made sufficiently large that a quasi-continuum of states is available. The quantum well 202 is coupled from beneath to an electrode 206, and the quantum well 204 is coupled from beneath an electrode 208. These are preferably degenerately doped semiconductor regions, or may be metal lines, but in any case provide the long-distance routing necessary for formation of conventional electronic circuits.

In the presently preferred version of this embodiment, the quantum wells 202 and 204 have only 2 components of momentum discretely quantized, since they are directly connected to their respective electrodes. That is, the electrodes 206 and 208 can be, for example, tungsten, with a thin layer of a conventional barrier metallization optionally provided on top. The GaAs of quantum wells 202 and 204 are formed directly on top of this conductor. Preferably the electrodes 206 and 208 are n+ GaAs. Optionally, a thin barrier of AlGaAs can be provided beneath each of the quantum wells 202 or 204 and above the respective contact 206 or 208. This barrier is sufficiently thin that it is readily tunnelled through, and therefore does not prevent DC coupling of each quantum well to its respective elecrode, but even this thin a barrier would be sufficiently small to provide sufficient quantization of all 3 parameters of momentum within each of the wells 202 and 204, and thereby increase the relative resonant tunneling gain at the expense of a small increase in processing complexity and small decrease in overall current.

A larger scale version of essentially this structure is shown in FIG. 9. This 3-terminal quantum well device can be configured with multiple chains of quantum well pairs 202, 204 in parallel, for greater current flow. Note that electrode 206 can be thought of as acting as a source, electrode 208 can be thought of as a gate electrode, and electrode 210 can be thought of as a drain electrode. Pattern 213 can be used to define the well locations 202 and 204. FIG. 10 shows a cross section of this structure, including ground plane 211.

Figure 11:
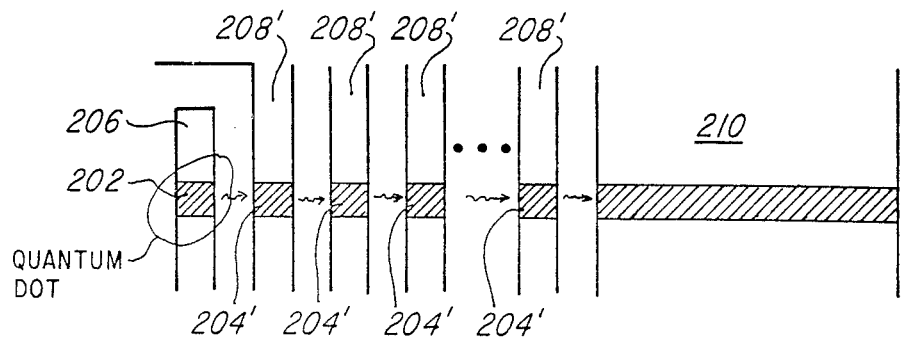
FIG. 11 shows a many-terminal device, which differs from the device of FIG. 9 in having multiple electrodes 208 prime for connection to multiple wells 204 prime in each chain.
Figure 12:
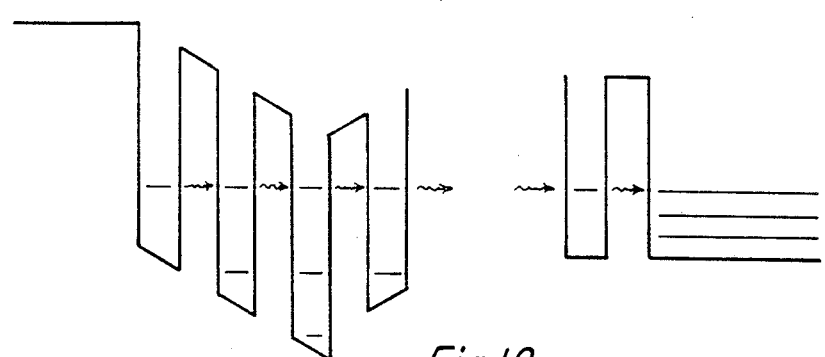
FIG. 12 shows a sample set of bias conditions for the embodiment of FIG. 11 wherein resonant tunnelling occurs.
Figure 13:
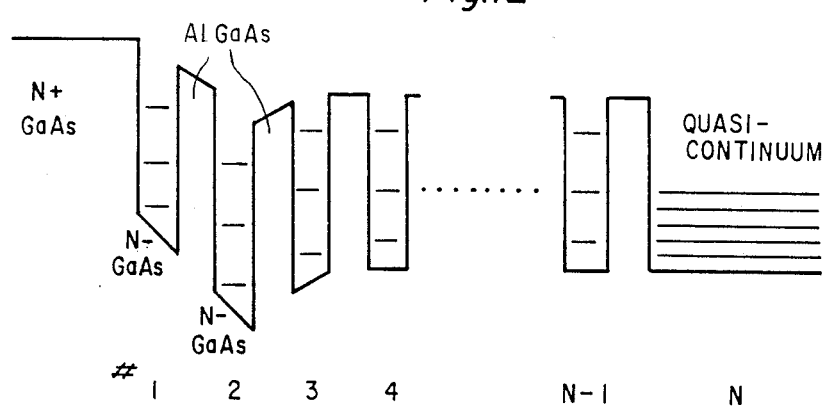
FIGS. 13 shows a sample set of bias conditions for the embodiment of FIG. 11 wherein resonant tunnelling occurs.

A further variation of this structure is shown in FIG. 11. Note that additional electrodes 208 prime are used to provide longer chains of wells 202, 204 prime, 204 prime, etc., wherein resonant tunneling will occur only if the voltages on all of the electrodes 206 and 208 prime jointly satisfy one single condition (or some one of a small set of conditions). That is, FIG. 12 shows a sample set of electrode bias conditions wherein resonant tunneling will not occur, and FIG. 13 shows a different set of bias conditions wherein resonant tunneling will occur.

This multiple-gate device is particularly useful for a read only memory.

Figure 14:
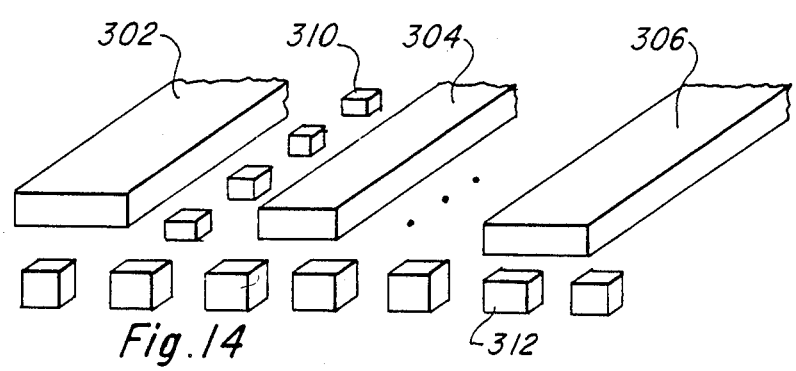
FIG. 14 shows a read-only memory according to one embodiment of the invention.

In a read only memory (ROM) embodiment, information is hard-programmed simply by changing the degree of electrical coupling of a column line to underlying quantum wells. A sample of this embodiment is shown in FIG. 14. A particular advantage of this embodiment is that the patterning of the metal lines need not be exactly aligned to the pattern of the underlying quantum wells. That is, if the pitch of the metal lines can be made twice or more that of the quantum wells, and the ROM will still function.

In the sample embodiment shown, column lines 302, 304, 306, etc. are overlying metal lines. Column line 302 is electrically coupled to row 310 of quantum wells, but not coupled (or less well coupled) to row 312 of quantum wells. This differential coupling can be accomplished by holes cut in a field plate, or by a dielectric patterned in multiple thicknesses. A sample mode of operation of this structure is as follows: A background potential is defined for every column (i.e., all columns fixed at ground) such that resonant tunneling occurs through each row of quantum devices 310, 312, etc. When it is desired to read out a column of cells, the column line 302 for that column is changed to some different voltage. This different voltage will perturb resonant tunneling in any row to which that column line is electrically coupled, and thereby disrupt resonant tunneling in that row. In rows to which this column is not electrically coupled resonant tunneling will not be disrupted. Thus, by monitoring the current in a row, the information hard-programmed into the intersection of the addressed column and the read-out row will be detected.

A sample process for fabricating quantum well devices according to the present invention will now be described. In particular, fabrication of 3-terminal devices, as discussed above, will be used as an example.

Figure 21:
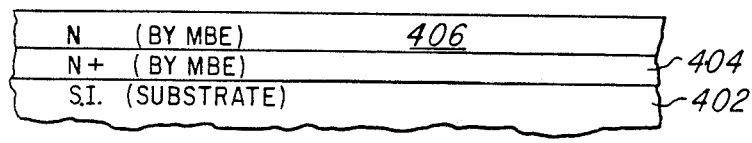
FIGS. 21–36 show steps in processing a sample three-terminal device according to the present invention.

The beginning material is a semi-insulating GaAs substrate with 2 epitaxial layers. The substrate is preferably chromium doped, e.g. to $10^{15}$ per cubic centimeter, although this is not necessary. The first epitaxial layer is n+ GaAs. This layer will provide connections, and is therefore fairly thick and of a fairly high conductivity, e.g. 5000 angstroms thick and doped to $10^{18}$ per cubic centimeter or more n type. On top of this is deposited the thin lightly doped n-type layer which will patterned to form the actual quantum wells. This layer is doped, e.g., about $10^{16}$ per cubic centimeter n-type, and, in a sample embodiment, is 150 angstroms thick. (The light doping is used merely so that some carriers are available. Heavier doping would increase inelastic tunnelling). FIG. 21 shows an initial structure, having epitaxial layes 404 and 406 atop substrate 402. Optionally, as discussed above, an extremely thin layer of AlGaAs could be interposed between layers 404 and 406. This structure is preferably fabricated by molecular beam epitaxy, to provide the desired sharp doping transitions, but this is not strictly necessary. Published chemical vapor deposition results, particularly using organo metallic CVD (MOCVD), also state results of extremely sharp transitions.

Figure 22:
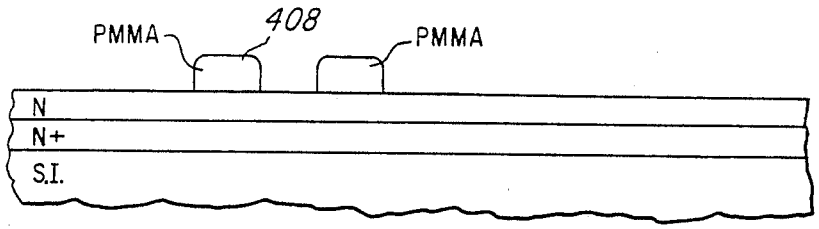
Figure 23:
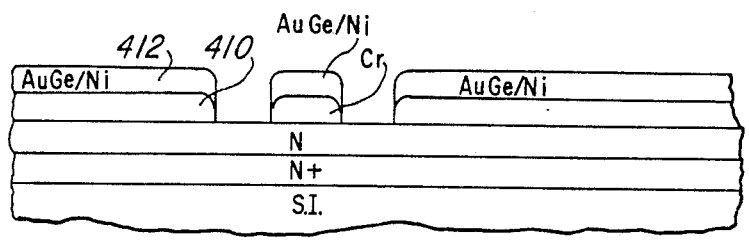
Figure 24:
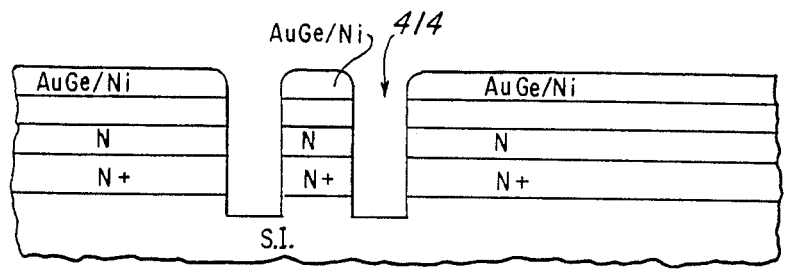

The first patterning step follows. In the presently preferred embodiment, patterning is done using electron beam with an E beam resist such as PMMA (polymethylmethacrylate). This is the presently preferred embodiment, because it provides a reliable way to make structures smaller than 0.1 microns today. Such dimensions are of course not possible using optical lithography, although x-ray or ion beam lithography may provide a more convenient to way to do such patterning in the future. FIG. 22 shows the epitaxial structure of FIG. 21, with a patterned layer of PMMA 408 (patterned by e-beam writing and developing) in place. A reactive ion etching (RIE) mask material is then deposited. In the presently preferred embodiment, an aluminum layer 410 and a gold/germanium/nickel layer 412 are used for this. The patterned layer 408 is then lifted off, to expose only selected fine line portions of the epitaxial layer 406, as seen in FIG. 23.

Reactive ion etching is now conventionally performed to cut trenches 414 through the epitaxial layer 406 and 404 down into the substrate 402. RIE conditions are conventionally known for such patterning, and extreme anisotropy is readily achieved at low pressure, at the expense of somewhat slow etching.

Figure 25:
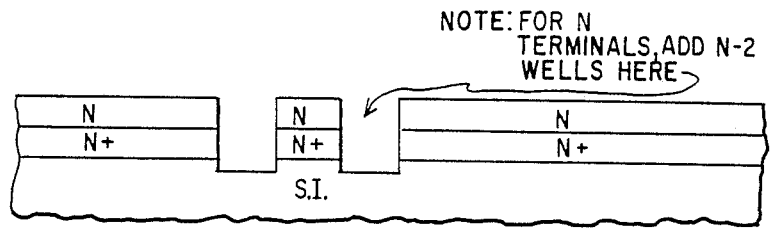

Next, the aluminum layer 410 is removed in dilute HCl to remove the RIE masking layer 410 and 412, as seen in FIG. 25.

Figure 26:
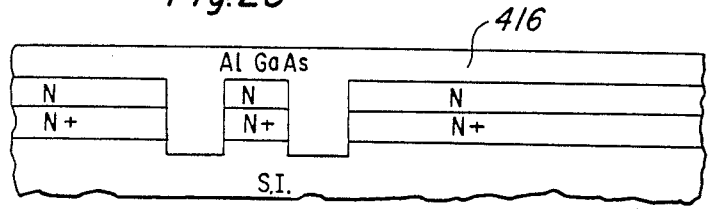

Next, as AlGaAs layer 416 is epitaxially regrown overall. This fills the trenches 414. It is preferable to perform this regrowth using molecular beam epitaxy. However, again, metal organic CVD is an alternative technology. However, in any case, it is important that this regrowth be of extremely high quality, since the sidewall interface between the GaAs wells formed from layer 406 and the AlGaAs fill 416 are extremely critical, as discussed above. This regrown structure shown in FIG. 26.

Figure 27:
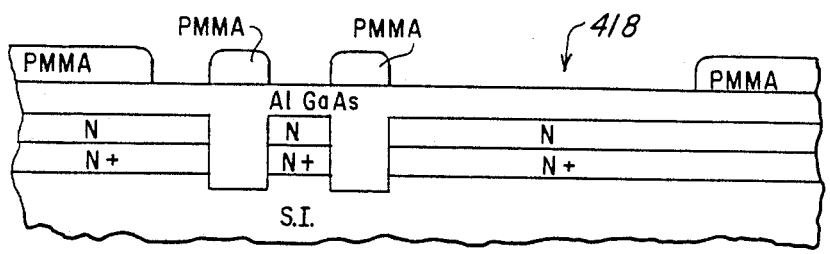
Figure 28:
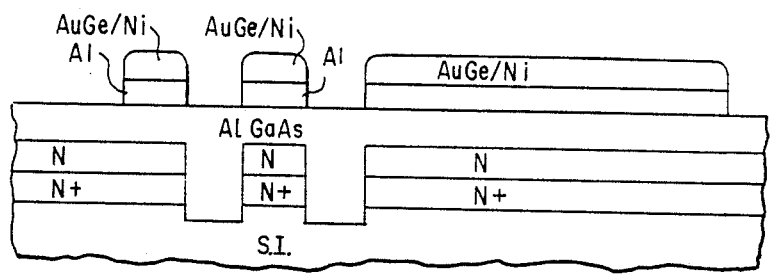
Figure 29:
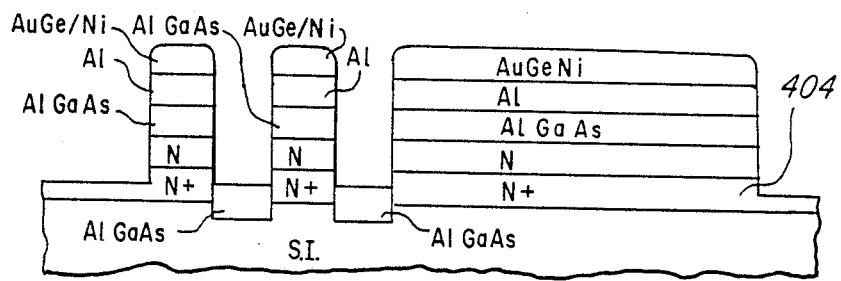

Next, a second patterning step is performed. The pattern used in this case is essentially the same pattern over the wells, but also includes the output contact in the finished structure. This pattern, seen in FIG. 27, is converted to a hard mask pattern, seen in FIG. 28, which is then reactive ion etched again. However, this reactive ion etching step has a critical depth control. It must be continued to etch into, but not through, the n+ layer 404. This critical depth control provides one reason for making the n+ layer 404 so thick, as discussed above.

Figure 30:
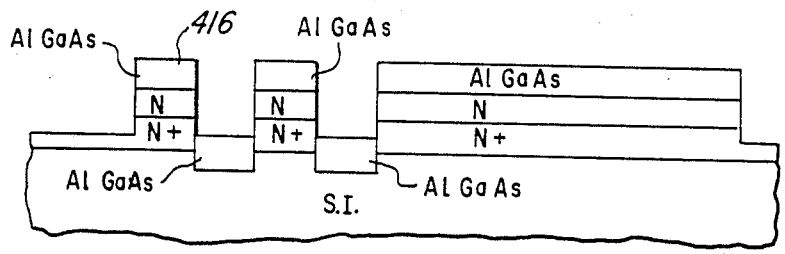
Figure 31:
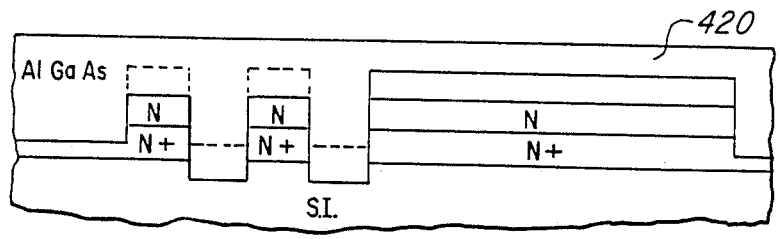

. Again, the masking metal is stripped (FIG. 30), and AlGaAs is regrown overall. As discussed above, the AlGaAs needs to have a high enough percentage of aluminum to impose a significantly different conduction band energy between the AlGaAs and GaAs, but it is preferable that the aluminum percentage not be too high, to provide for the best possible GaAs to AlGaAs interface. In the presently preferred embodiment, a composition of about $Al_{0.3}Ga_{0.7}As$ is used. FIG. 31 shows the resulting structure, with the new AlGaAs layer 420. Note that, in FIG. 30, some portions of the AlGaAs layer 416 survive, and these portions are incorporated in the layer 420. Again, the layer 420 must be epitaxial grown with extremely good interface qualtiy.

Figure 32:
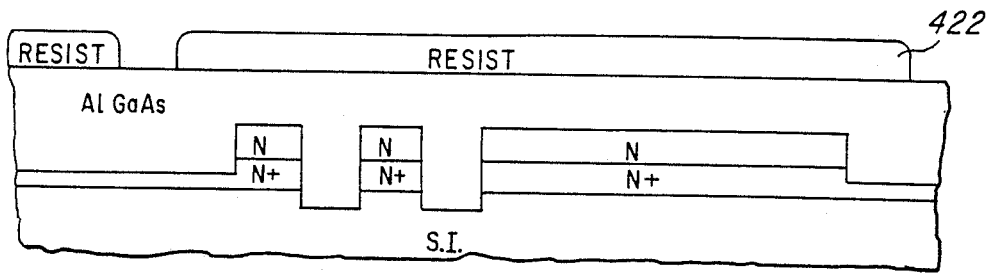
Figure 33:
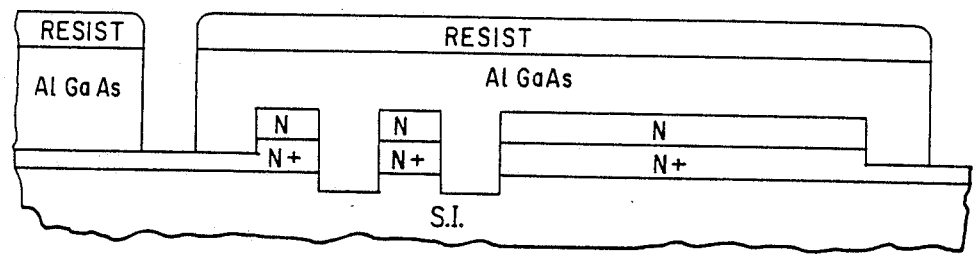
Figure 34:
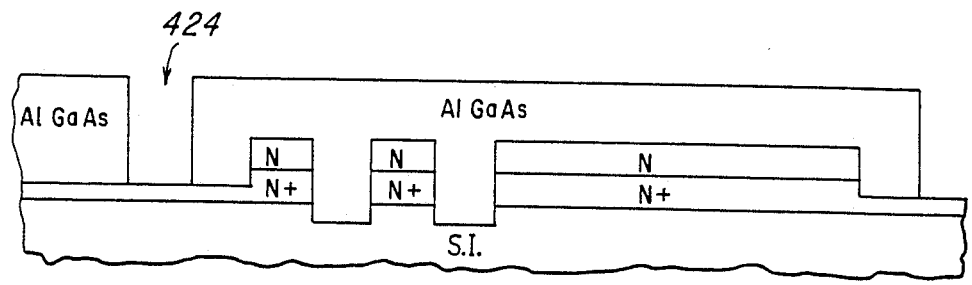
Figure 35:
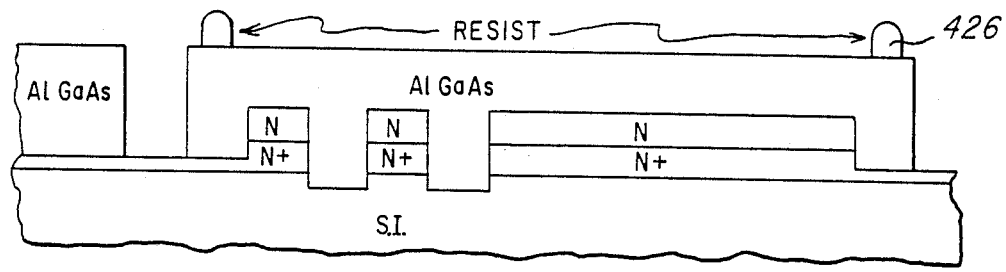
Figure 36:
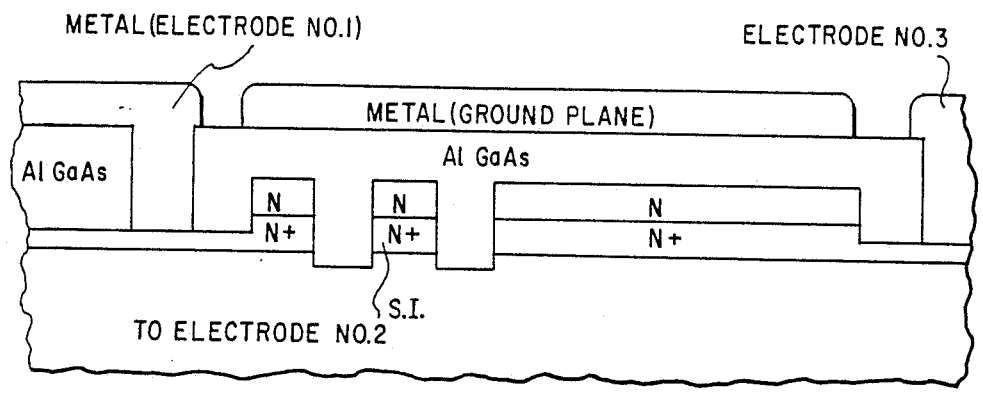
Figure 37:
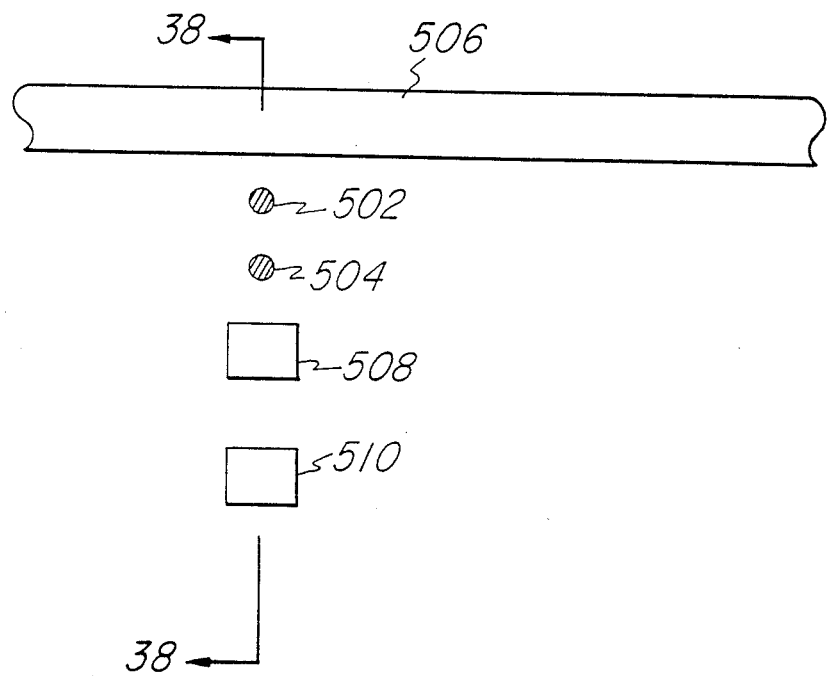
Figure 38:
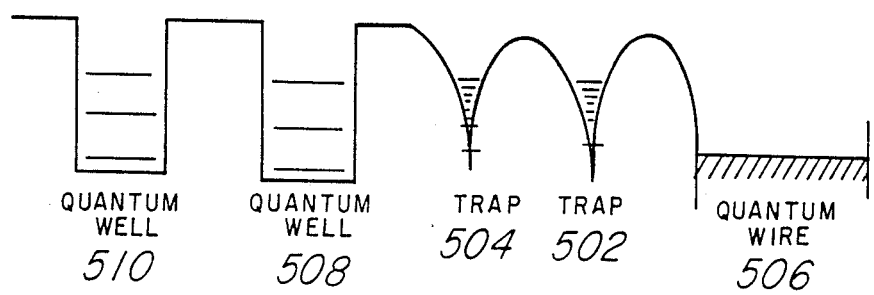

A contact metallization pattern is then applied, as shown in FIG. 32. The geometries are less demanding at this step and optical resist 422 with optical patterning is preferably used. A selective etch is then used, which will etch through AlGaAs and stop on n+ GaAs. Hydrogen fluoride has this property. This step provides contact holes 424, as seen in FIG. 34. Metallization patterning is then applied, again preferably using an optical resist 426, as seen in FIG. 35, and metal (such as AuGe/Ni) is then deposited, e.g. by evaporation, and lift off patterned, resulting in the structure as shown in FIG. 36.

A very similar fabrication technique can be used to fabricate quantum well array structure, e.g. for ROMs, simply by performing the second patterning step (shown in FIG. 27) to define linear patterns at right angles to linear patterns defined by the first patterning step, so that the intersection of the two defines locations of the quantum well dots.

A basic difficulty in interconnecting quantum well devices according to the present invention to form random logic circuit is their electrical characteristics. These devices may be considered to have very high input impedance and very low output impedance. In a further aspect of the present invention, a circuit structure for output coupling is described which permits the output of quantum well devices according to the present invention to switch macroscopic currents, i.e. currents comparable to those normally used in integrated circuit wiring. These macroscopic currents can then be used to change electric potentials and therby switch further stages of quantum well devices.

It is known in the prior art that macroscopic resist changes can be detected in a very thin wire due to trapping of a single electron onto a trap at or near the interface of the wire to the substrate. See the K. Raals et al. paper in 52 Phys. Rev. Letters 228 (1984). That is, in extremely small metal wires, e.g. 100 Angstroms by 100 Angstroms, the cross section of a scattering center which is close to the wire will change by many orders of magnitude depending on whether an electron is or is not trapped in the scattering center. This tremendous change in scattering causes a net change in the resistance of the wire.

This effect need not be limited to wires of such small dimension. By using multiple trapping sites (scattering centers), the resistance of a larger wire can be similarly modulated. In particular, where a thin or wide wire is used, a dielectric with traps coated over the surface of the wire can substantially modulate the wires resistance as the traps are populated and depopulated. To accomplish charging of the traps, a field plate is preferably used, which provides a bias normal to the surface of the wire. Thus, the current output of a quantum well device stage (which would of course normally include multiple quantum well chains in parallel can be coupled into a thin flat wire, while a field plate bias is applied vertically to assist charge injection from the wire over the energic barrier into trapping sites in the dielectric. The charges thus trapped will modulate the resistance of the wire after the vertical bias is removed and the current signal through the wire can then be used to trip a sense amplifier. Thus, this scattering center modulation in effect provides a latch suitable for conversion of the quantum well output signals to macroscopic signals.

This embodiment will now be discussed in greater detail. First, the dimensions of the wire next to the scattering site must be such that the wire is in what is known as the Anderson localization regime: the wave function of the electron must significantly overlap the entire periphery of the wire, i.e. all four faces of a square wire. In this regime, the resistance will be extremely sensitive to surface states adjacent to the wire. There will typically be many unintentionally generated surface states, but these normally have low activation energy. Thus, the operating temperature is selected so that these unwanted surface states will boil off readily, i.e., selected such that kT is comparable to or larger than the activation energy of these parasitic surface states, but such that the activation energy of the surface states in which charges to be trapped to effect modulation is more than several times as much as kT. Thus, the principle application of this output amplifier stage is believed to be for devices operating at temperatures in the neighborhood of 77 kelvin, i.e. liquid nitrogen temperatures. However, higher operating temperatures can be used if carriers can be injected into deeper surface states.

The surface states used in the presently preferred embodiment are about 20 to 30 meV or more removed from the conduction band energy of the metal.

Operation in the Anderson localization regime means that the dimensions of the wire close to the scattering center cannot possibly be greater than $500 \times 500$ angstroms, and are preferably closer to $100 \times 100$ angstroms. For a $100 \times 100$ angstrom wire, the resistance of the wire is roughly 100K to one megohm per micron. Each scattering center which is populated or depopulated can impose a resistance change of a percent or so, and by using several such scattering centers, a total resistance change of 5% or so is achieved. Thus, these metal lines are used in pairs, and a change in current of a few percent is easily enough to trip a conventional sense amplifier.

The presently preferred embodiment for accomplishing carrier injection into these traps is to have the trapping site connected to the last well in a chain of quantum wells by tunneling, i.e., the separation from the trapping site to the last well in the chain should be removed from the trapping site by no more than a few times the distance between wells, and preferably less. Tunneling out of the trap into the last well is not a limitation in the preferred embodiment since the electron enters the trap through excited states. The reverse tunneling is only inelastic. However, for a sufficiently deep trap, the required phonon energy becomes so large that the inelastic tunneling is negligible. The trapping site can be written with extreme precision using a focused ion beam.

Figure 15:
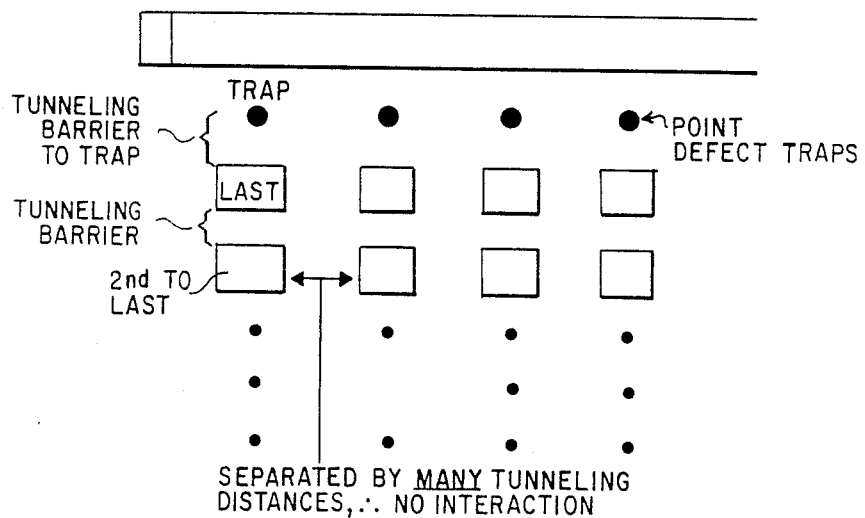
FIG. 15 shows a sample output switch configuration used in practicing the present invention, wherein quantum-well devices switch macroscopic output currents.

Thus, the configuration of this output stage is shown in FIG. 15.

Figure 16:
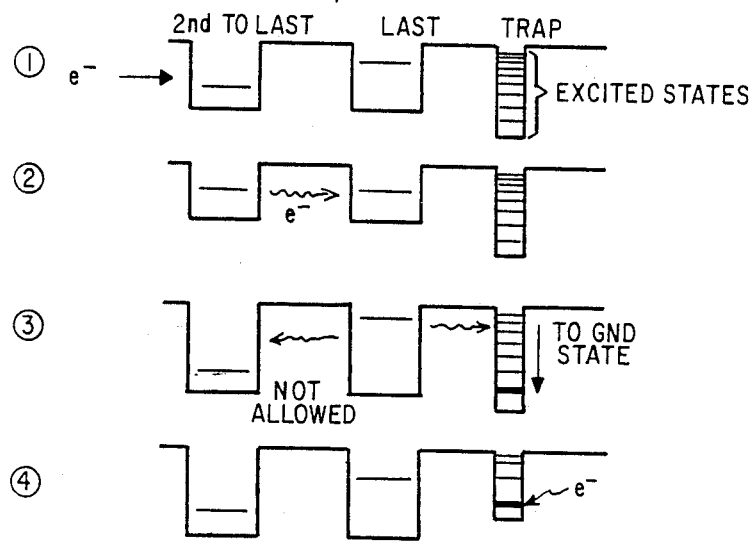
FIG. 16 shows the effect of the electric potential change induced by the population of well levels on the permissible tunnelling transitions in a further class of embodiments.

As mentioned, one-way well coupling is optionally used to assist injection of carriers into these traps, to modulate the metal lines resistance. This one-way coupling is made possible by the self-consistant tunneling effects of the wells. That is, in addition to the factors discussed above, the presence or absence of electrons in the wells will itself modulate the electric field bewtween wells. Thus, as shown in FIGS. 16 A and B, the change in electric field caused by the presence of an additional carrier in a second well can itself be sufficient to forbid tunneling. Thus, a carrier will readily tunnel from well 1 into a depleted level in well 2, but that same carrier cannot tunnel back into well 1 except through inelastic channels, because now the levels no longer line up.

For this self-generated field modification to be useful, it is necessary that the resonant peaks at the given operating temperature be relatively sharp. That is, the well dimensions should preferably be smaller than those necessary, at the operating tempeature, or any resonant tunneling gain. For example, wells of appropriate dimensions for operation at room temperature will show such effects if operated at 77K or at 4K. The smaller wells mean that the field generated by the potential shift caused by the addition of one carrier will be greater.

Figure 17:
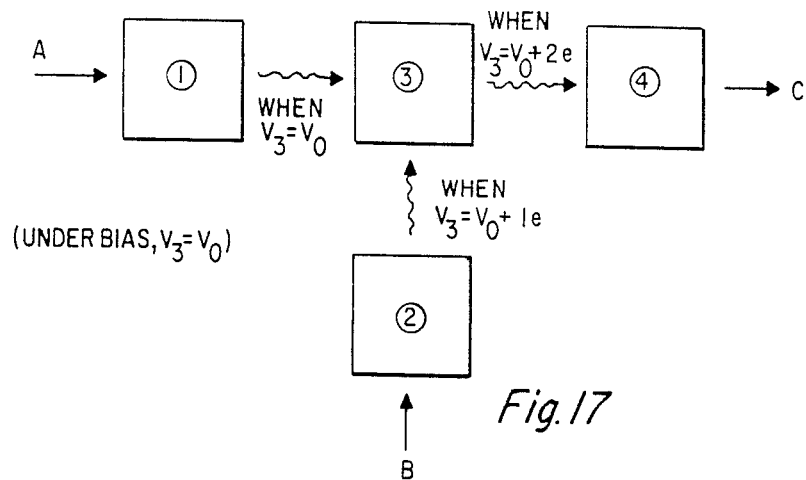
FIG. 17 shows an AND gate configured using quantum-well logic with self-consistent tunnelling restrictions.

These self-generated field effects have other uses also. For example, consider the four-well structure shown in FIG. 17. A field plate or other bias connection is used to define a reference voltage $V_0$ for well 3. The wells are tailored such that tunneling occurs from well 1 to well 3 only when $V_3$ equals $V_0$; tunneling occurs from well 2 to well 3 only when $V_3$ equals $V_0$ plus E, i.e., when the potential of well 3 has been modified by the presence of one electron; tunneling occurs from well 3 to well 4 only when well 3 has a potential $V_3$ equals $V_0$ plus 2E. Input Signal A supplies carriers tunneling into well 1, and input signal B supplies cariers tunneling into well 2, and an output contact retrives an output signal C from well.

Thus, this primitive complex of wells provides an AND gate.

Other Boolean primitives are easily created. For example, in the same layout of wells, if we redefine the well couplings such that the tunneling occurs from well 1 to well 3 when $V_3$ equals $V_0$, from well 2 to well 3 when $V_3$ equals $V_0$, and from well 3 to well 4 when $V_3$ equals $V_0$ plus E, we now have an OR gate. These couplings can be used to configure all primitive Boolean algebraic logic cells and more. In this regime, where self-generated fields are sufficient to disrupt tunneling, a problem may be caused by the presence of excess carriers in a well. That is, if the coupling between wells A and B is designed to admit resonant tunneling when well A is populated and well B is not, tunneling may be disrupted if well A has two states populated rather than merely one. However, in such cases, the 2-carrier population must have been created inelastically. Moreover, inelastic tunneling will provide a reset mechanism eventually.

A further family of the embodiments of the present invention utilize vertical tunneling. An attraction of such structures is that extremely small dimensions, with extremely good interface quality are easier to achieve in the vertical dimension then in the lateral dimension.

A key feature of such embodiments is that the spacing of energy states in the well is in general defined by the volume of the well. Thus, for a given well volume the well may be configured as a thin flat box rather than a roughly cubic box. In this case, two of the momentum comnponents would be quantized with extremely closely spaced values, and the third component would be quantized with extremely widely spaced allowable momentum values.

Figure 19:
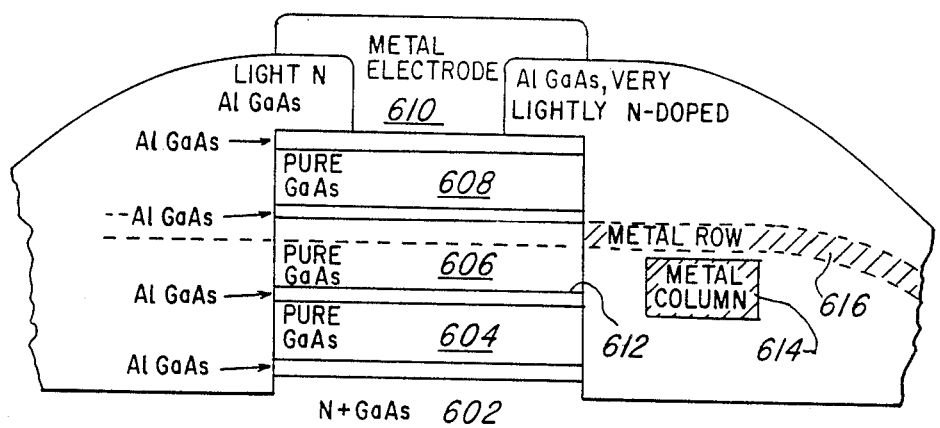
FIGS. 19 and 20 show two embodiments of vertical-tunnelling quantum-well device structures according to the invention.
Figure 18:
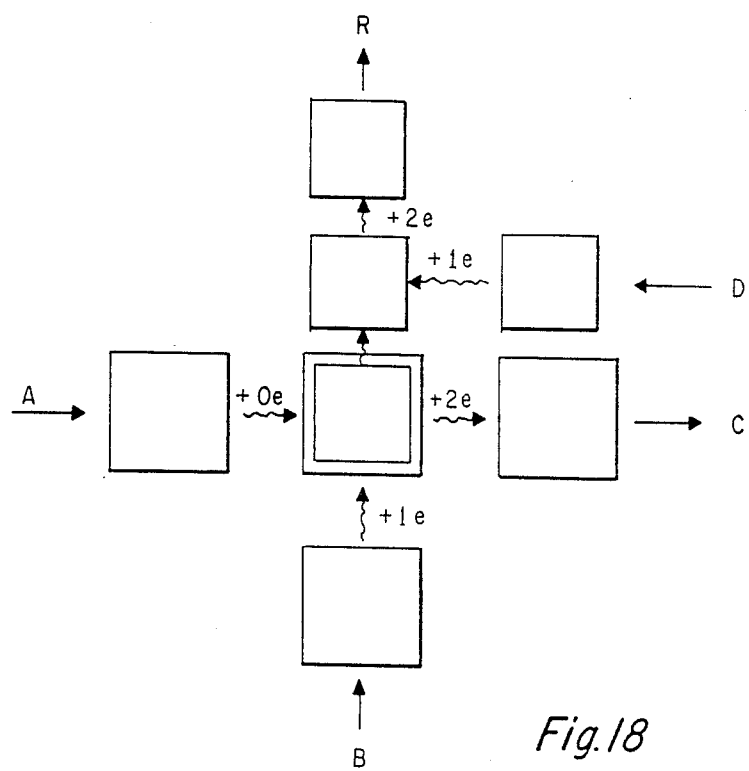
FIG. 18 shows a more complex logic element configured using quantum-well logic with self-consistent tunnelling restrictions.
Figure 20:
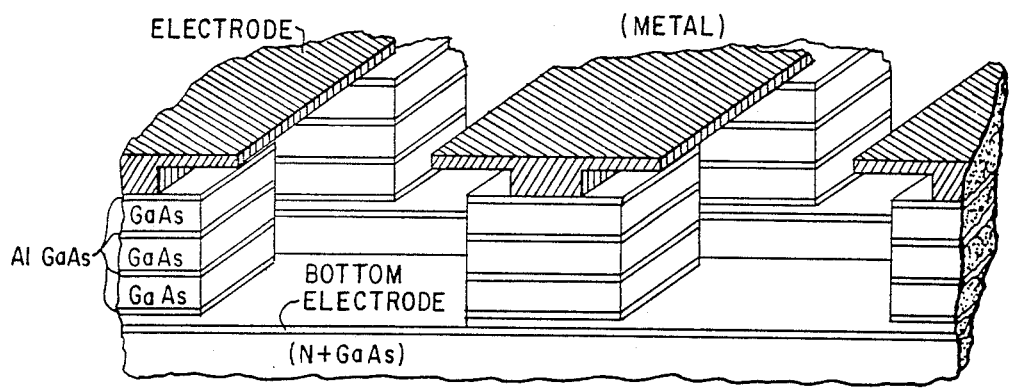

Such embodiments are shown in FIGS. 19 through 20. Again, the wells 604–608 are preferably made of a first semiconductor and the barrier medium 612 is preferably made of a second, wider-band gap semiconductor. Gallium arsenide and AlGaAs are preferable for these two semiconductors. Current flows from n+ electrode 602 to metal electrode 610 only if the potentials of row line 616 and column line 614 permit levels of well 606 to line up with levels of wells 604 and 68, as discussed above.

Thus, the present invention provides the above-mentioned objects, as well as numerous other technical advantages in accordance with the foregoing description. As will be apparent to those skilled in the art, the present invention is a pioneering invention, and can be modified with an immense variety of modification and variations. For example, Si wells can be used in an $SiO_2$ barrier medium, or other semiconductor/semiconductor or semiconductor/insulator systems can be used, in place of the preferred GaAs/AlGaAs materials system. The scope of the present invention is not limited except as set forth in the accompanying claims.

What is claimed is:

1. A semiconductor logic device, comprising:
   (a) a plurality of quantum wells, said wells separated by tunneling barriers and of size to quantize all three components of momemtum of carrier in said wells;
   (b) at least one pair of adjacent ones of said wells having carrier states that are in resonance only if the carrier population of a first of said pair differs from the carrier population of the other of said pair; and
   (c) at least one input and output for said plurality, whereby carriers injected by said input into certain of said wells resonantly tunnel unidirectionally from well to well and are withdranw from certain of said wells by said output.

2. The semiconductor logic device of claim 1, wherein:
   (a) said quantum wells are cubic shape.

3. The semiconductor logic device of claim 1, wherein:
   (a) said carriers are electrons.

4. The semiconductor logic device of claim 1, wherein:
   (a) said quantum wells are made of $Al_xGa_{1-x}As$;
   (b) said tunneling barriers are made of $Al_zGa_{1-z}As$; and
   (c) the equipopulated nonresonance of said pair is induced by bias.

5. The semiconductor logic device of claim 1, wherein:
   (a) said first of two wells is made of $Al_xGa_{1-x}As$;
   (b) said other of two wells is made of $Al_yGa_{1-y}As$; and
   (c) said tunneling barriers are made of $Al_zGa_{1-z}As$.

6. The semiconductor logic device of claim 1, wherein:
   (a) said plurality includes first, second, third, and fourth wells with resonant carrier states as follows: (i) one carrier in said first well with no carriers in said third well, (ii) one carrier in said second well with one carrier in said third well, and (iii) two carriers in said third well with no carriers in said fourth well, whereby after resonant tunneling said fourth well occupation is a logical AND of said first and second well occupations.

7. The semiconductor logic device of claim 1, wherein:
   (a) said plurality includes first, second, third, and foruth wells with resonant carrier states as follows: (i) one carrier in said first well with no carriers in said third well, (ii) one carrier in said second well with no carriers in said third well, and (iii) one carrier in said third well with no carriers in said fourth well, whereby after resonant tunneling said fourth well occupation is a logical OR of said first and second well occupations.

8. A semiconductor logic device, comprising:
   (a) a plurality of quantum wells, said wells separated by tunneling barriers and of size to quantize all three components of momemtum of carriers in said wells;
   (b) at least two of said wells of unequal singlecarrier energy states such that the presence of carriers in a first of said two wells is necessary for resonance of acrrier states between said two wells; and
   (c) at least one input and output for said plurality, whereby carriers injected by said input into certain of said wells resonantly tunnel unidirectionally from well to well and are withdrawn from certain of said wells by said output.

9. The semiconductor logic device of claim 8, wherein:

(a) said quantum wells are cubic shape.

10. The semiconductor logic device of claim 8 wherein:
   (a) said carriers are electrons.

11. The semiconductor logic device of claim 8, wherein:
   (a) said quantum wells are made of $Al_xGa_{1-x}As$;
   (b) said tunneling barriers are made of $Al_zGa_{1-z}As$; and
   (c) said unequal unpopulated potentials are induced by bias.

12. The semiconductor logic device of claim 8, wherein:
   (a) said first of two wells is made of $Al_xGa_{1-x}As$;
   (b) said other of two wells is made of $Al_yGa_{1-y}As$; and
   (c) said tunneling barriers are made of $Al_zGa_{1-z}As$.

13. The semiconductor logic device of claim 8, wherein:
   (a) said plurality includes first, second, third, and fourth wells with resonant carrier states as follows: (i) one carrier in said first well with no carriers in said third well, (ii) one carrier in said second well with one carrier in said third well, and (iii) two cariers in said third well with no carriers in said fourth well, whereby after resonant tunneling said fourth well occupation is a logical AND of said first and second well occupations.

14. The semiconductor logic device of claim 8, wherein:
   (a) said plurality includes first, second, third, and fourth wells with resonant carrier states as follows: (i) one carrier in said first well with no carriers in said third well, (ii) one carrier in said second well with no carriers in said third well, and (iii) one carrier in said third well with no carriers in said fourth well, whereby after resonant tunneling said fourth well occupation is a logical OR of said first and second well occupations.

15. A semiconductor logic device, comprising:
   (a) a plurality of quantum wells, said wells separated by tunneling barriers and each of said wells of size to quantize all three components of momemtum of carriers in said well;
   (b) at least two of said wells of unequal but related sizes, said sizes related by the presence of one or more carriers in a first of said two wells necessary for carrier states in said wells to be in resonance; and
   (c) at least one input and output for said plurality, whereby carriers injected by said input into certain of said wells resonantly tunnel unidirectionally from well to well and are withdrawn from certain of said wells by said output.

16. The semiconductor logic device of claim 15, wherein:
   (a) said quantum wells are cubic shape.

17. The semiconductor logic device of claim 15, wherein:
   (a) said carriers are electrons.

18. The semiconductor logic device of claim 15, wherein:
   (a) said quantum wells are made of $Al_xGa_{1-x}As$; and
   (b) said tunneling barriers are made of $Al_zGa_{1-z}As$;

19. The semiconductor logic device of claim 15, wherein:
   (a) said first of two wells is made of $Al_xGa_{1-x}As$;
   (b) said other of two wells is made of $Al_yGa_{1-y}As$; and
   (c) said tunneling barriers are made of $Al_zGa_{1-z}As$.

20. The semiconductor logic device of claim 15, wherein:
   (a) said plurality includes first, second, third, and fourth wells with resonant carrier states as follows: (i) one carrier in said first well with no carriers in said third well, (ii) one carrier in said second well with one carrier in said third well, and (iii) two carriers in said third well with no carriers in said fourth well, whereby after resonant tunneling said fourth well occupation is a logical AND of said first and second well occupations.

21. The semiconductor logic device of claim 15, wherein:
   (a) said plurality includes first, second, third, and fourth wells with resonant carrier states as follows: (i) one carier in said first well with no carriers in said third well, (ii) one carrier in said second well with no carriers in said third well, and (iii) one carrier in said third well with no carriers in said fourth well, whereby after resonant tunneling said fourth well occupation is a logical OR of said first and second well occupations.

* * * * *